United States Patent
Briseno-Vidrios et al.

(10) Patent No.: US 11,539,559 B2
(45) Date of Patent: Dec. 27, 2022

(54) DEMODULATOR FOR AN ISOLATION COMMUNICATION CHANNEL FOR DUAL COMMUNICATION

(71) Applicant: Skyworks Solutions, Inc., Irvine, CA (US)

(72) Inventors: Carlos Jesus Briseno-Vidrios, Austin, TX (US); Michael R. May, Austin, TX (US); Patrick De Bakker, Hollis, NH (US)

(73) Assignee: Skyworks Solutions, Inc., Irvine, CA (US)

( * ) Notice: Subject to any disclaimer, the term of this patent is extended or adjusted under 35 U.S.C. 154(b) by 237 days.

(21) Appl. No.: 17/066,242

(22) Filed: Oct. 8, 2020

(65) Prior Publication Data

US 2022/0116250 A1   Apr. 14, 2022

(51) Int. Cl.
*H04L 27/06* (2006.01)
*H03M 1/38* (2006.01)
*H03K 17/56* (2006.01)

(52) U.S. Cl.
CPC .............. *H04L 27/06* (2013.01); *H03K 17/56* (2013.01); *H03M 1/38* (2013.01)

(58) Field of Classification Search
CPC ........... H04L 27/06; H03K 17/56; H03M 1/38
See application file for complete search history.

(56) References Cited

U.S. PATENT DOCUMENTS 6,100,717 A    8/2000  May
8,064,872 B2  11/2011  Dupuis
(Continued)

FOREIGN PATENT DOCUMENTS

JP     2014207668    10/2014

OTHER PUBLICATIONS

Analog Devices, "Single Gate, Adjustable Slew Rate, Isolated Gate Driver, 3 A Short-Circuit (<3 Ω)," ADuM4122 Data Sheet, downloaded from https://www.analog.com/en/search.html?q=adum4122, Jun. 16, 2020, 18 pages.

(Continued)

*Primary Examiner* — Rahel Guarino
(74) *Attorney, Agent, or Firm* — Knobbe, Martens, Olson & Bear, LLP

(57) ABSTRACT

An integrated circuit includes a demodulator to demodulate a signal simultaneously transmitted over an isolation communication channel and obtain gate information and configuration information. The demodulator includes a gate demodulation path and a configuration demodulation path. The received signal oscillates at a first frequency to represent a first state, oscillates at different frequencies to represent a seconds state, oscillates at a third frequency (or third and fourth frequencies), which are lower than the first frequency, to represent a third state, and the received signal is steady state to represent a fourth state. The gate demodulation path detects the first and second states. The configuration demodulation path includes first and second sub-demodulation paths. An envelope detector in the first sub-demodulation path detects the second state and the second sub-demodulation path detects the third state. The configuration demodulation paths uses an output of the gate demodulation path.

21 Claims, 11 Drawing Sheets

(56) References Cited

U.S. PATENT DOCUMENTS

| | | |
|---|---|---|
| 8,847,503 B2 | 9/2014 | Chang et al. |
| 9,608,623 B1 | 3/2017 | Kandah et al. |
| 9,812,989 B1 | 11/2017 | Dupuis |
| 9,966,837 B1 | 5/2018 | Seaton |
| 10,097,166 B1 | 10/2018 | Ludicky |
| 10,651,752 B1 | 5/2020 | Liu et al. |
| 2005/0036247 A1 | 2/2005 | Liu |
| 2006/0008075 A1 | 1/2006 | Scott et al. |
| 2006/0291589 A1 | 12/2006 | Eliezer et al. |
| 2007/0242780 A1 | 10/2007 | May et al. |
| 2008/0025450 A1 | 1/2008 | Alfano et al. |
| 2008/0192509 A1 | 8/2008 | Dhuyvetter et al. |
| 2009/0017773 A1 | 1/2009 | Dupuis et al. |
| 2009/0147545 A1 | 6/2009 | Melanson |
| 2009/0206817 A1 | 8/2009 | Ng et al. |
| 2009/0212759 A1 | 8/2009 | Melanson |
| 2009/0213914 A1 | 8/2009 | Dong et al. |
| 2010/0118918 A1 | 5/2010 | Dupuis |
| 2013/0009674 A1 | 1/2013 | Reese et al. |
| 2013/0264961 A1 | 10/2013 | Chong et al. |
| 2014/0049297 A1 | 2/2014 | Nagai et al. |
| 2014/0328427 A1* | 11/2014 | Chang .................. H05B 45/50 375/259 |
| 2015/0171901 A1 | 6/2015 | Dupuis et al. |
| 2015/0180228 A1 | 6/2015 | Mills et al. |
| 2015/0234415 A1 | 8/2015 | Sicard et al. |
| 2016/0056829 A1 | 2/2016 | Adam et al. |
| 2017/0033603 A1 | 2/2017 | Peter et al. |
| 2018/0013419 A1 | 1/2018 | Imanishi et al. |
| 2018/0062678 A1 | 3/2018 | Ragnonese et al. |
| 2019/0215920 A1 | 7/2019 | Bemnd et al. |
| 2019/0222107 A1 | 7/2019 | Morokuma et al. |
| 2019/0222126 A1 | 7/2019 | Parisi et al. |
| 2019/0229603 A1 | 7/2019 | Dubois et al. |
| 2019/0267985 A1 | 8/2019 | Le et al. |
| 2019/0348355 A1 | 11/2019 | May et al. |
| 2019/0386651 A1 | 12/2019 | Ying et al. |
| 2020/0076416 A1 | 3/2020 | Bang et al. |
| 2020/0266718 A1 | 8/2020 | Liu et al. |
| 2022/0014016 A1 | 1/2022 | Jin |

OTHER PUBLICATIONS

Frank, W., et al., "Real-Time Adjustable Gate Current Control IC Solves DV/DT Problems in Electric Drives," PCIM Europe, May 20-24, 2014, Infineon Technologies AG Germany, ISBN 978-3-8007-3603-4, pp. 98-104.

Infineon, E i c e D R I V E R™ High Voltage Gate Driver IC With Reinforced Isolation, Final Data Sheet Revision 2.1, Oct. 22, 2018, 34 pages.

Silicon Labs, "AN1009: Driving MOSFET and IGBT Switches Using the Si828x," Rev. 0.1, downloaded from https://www.silabs.com/ . . . /AN1009-driving-mosfet-and-igbt-switches-using-the-si828x on Aug. 28, 2020, 22 pages.

* cited by examiner

| Drive Current Configuration as a Function of Voltage or Resistance | | | | | | | | | |
|---|---|---|---|---|---|---|---|---|---|
| Selection 0:7 | S0 | S1 | S2 | S3 | S4 | S5 | S6 | S7 | S8 |
| CONFIG P/N Resistor (kohms) | 0 | 3.57 | 4.42 | 5.9 | 7.87 | 10 | 12.4 | 15.4 | highZ |
| Voltage Level (mv) | 0 | 178.5 | 221 | 295 | 393.5 | 500 | 620 | 770 | >850 |
| Drive Current % of Controlled Value | 8.75% | 12.5% | 17.5% | 25% | 35% | 50% | 70% | 100% | |
| Digital/ disable | p/nfet str low | | | | | | | | p/nfet str high/ disable |

DEMODULATOR FOR AN ISOLATION COMMUNICATION CHANNEL FOR DUAL COMMUNICATION

CROSS-REFERENCE TO RELATED APPLICATION(S)

This application relates to the application entitled "Transmitter For Dual Communication Over An Isolation Channel", naming Carlos Jesus Briseno-Vidrios et al. as inventors, application Ser. No. 17/066,244, filed Oct. 8, 2020, and this application relates to the patent application entitled "Interface For Passing Control Information Over An Isolation Channel" naming Michael R. May et al. as inventors, application Ser. No. 17/066,251, filed Oct. 8, 2020, all of which applications were filed on the same day as the present application and all of which applications are incorporated herein by reference.

BACKGROUND

Field of the Invention

The invention relates to isolation technology and more particularly to communication across an isolation barrier.

Description of the Related Art

Isolation communication channels are utilized in various applications where necessary to prevent current flow between isolated electric circuits by using an isolation barrier while still maintaining communication between the circuits. The isolation may be required for signal isolation, safety, or for other reasons. Communication between isolated circuits has typically involved a transmitter and receiver communicating over an isolation communication channel to provide, e.g., control information between the different voltage domains. The isolation communication channel may be implemented, e.g., using capacitive, inductive (transformers), or optical (opto-isolators) isolation techniques. In a typical isolation application, a control system provides one or more control signals for controlling a load system. During normal operation, a large DC or transient voltage difference may exist between the domain of the control system and the domain of the load system, thus requiring an isolation barrier between the control system and the load system. Isolation of the circuits in the separate voltage domains using an isolation barrier prevents damaging currents from flowing between the control system and the load system by a direct conduction path, while the isolation communication channel allows communication between the two systems.

FIG. 1 illustrates a prior art system 100 that includes an isolated gate driver 101. The gate driver 101 receives control information for driving a gate signal of a high-power transistor 102 that is electrically isolated from the control functionality providing the control information. In the exemplary system 100, controller 103, which may be a microprocessor, microcontroller, or other suitable processing device, operates in a first domain (i.e., a domain including VDD1 and VDD2). The controller 103 provides a gate signal to control a load system operating in a second domain i.e., a domain including VDD3 and VDD4. The isolation barrier electrically isolates the primary side including VDD1 (e.g., less than twenty volts) and VDD2 (e.g., less than twenty volts) and devices coupled thereto, from the secondary side including VDD3 (e.g., tens of volts) and VDD4 (e.g., hundreds of volts) and devices coupled thereto.

The isolated gate driver 101 includes a transmitter circuit 106 and a receiver circuit 108, which communicate over an isolation communication channel 109. In the system 100, controller 103 supplies gate information (GATE) to the transmitter circuit 106 in the first voltage domain. The transmitter circuit 106 transmits the gate information to the receiver circuit 108 in the second voltage domain. The receiver circuit 108 uses the gate information to generate a gate drive signal 120 to drive the high-power transistor 102 that is used to control a system load.

While the isolated gate driver allows communication across the isolation barrier, improvements in such communication is desirable to provide more precise control over the system load.

SUMMARY OF EMBODIMENTS OF THE INVENTION

Accordingly, in one embodiment a method includes receiving a signal transmitted across a single isolation communication channel as a received signal. The method further includes demodulating the received signal to determine respective values for gate information and configuration information contained in the received signal based on which of four states the received signal represents.

In another embodiment, an apparatus includes one or more input terminals to receive a signal transmitted across an isolation communication channel. A demodulator circuit is coupled to the one or more input terminals to demodulate a received signal to obtain gate information and to obtain configuration information. Respective values of the gate information and the configuration information are determined according to which one of four states the demodulator circuit detects in the received signal.

In another embodiment an integrated circuit includes aa demodulator to demodulate a signal received from an isolation communication channel to obtain gate information and configuration information simultaneously transmitted over the isolation communication channel. The demodulator includes a plurality of demodulation paths. The signal includes a first state in which the signal oscillates at a first frequency for a first bit time, a second state wherein the signal oscillates at different frequencies during a second bit time, a third state in which the signal oscillates at a third frequency lower than the first frequency during at least a portion of a third bit time, and a fourth state in which the signal is steady state for a fourth bit time. An envelope detector in one of the demodulation paths detects the second state.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
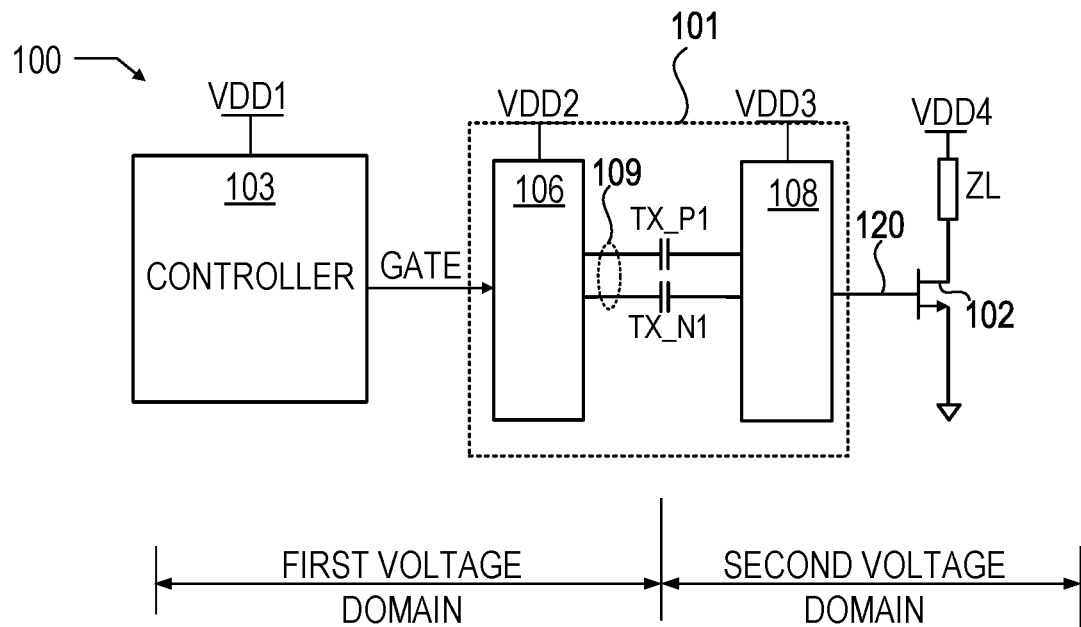
FIG. 1 illustrates a prior art system with an isolated gate driver.
Figure 2A:
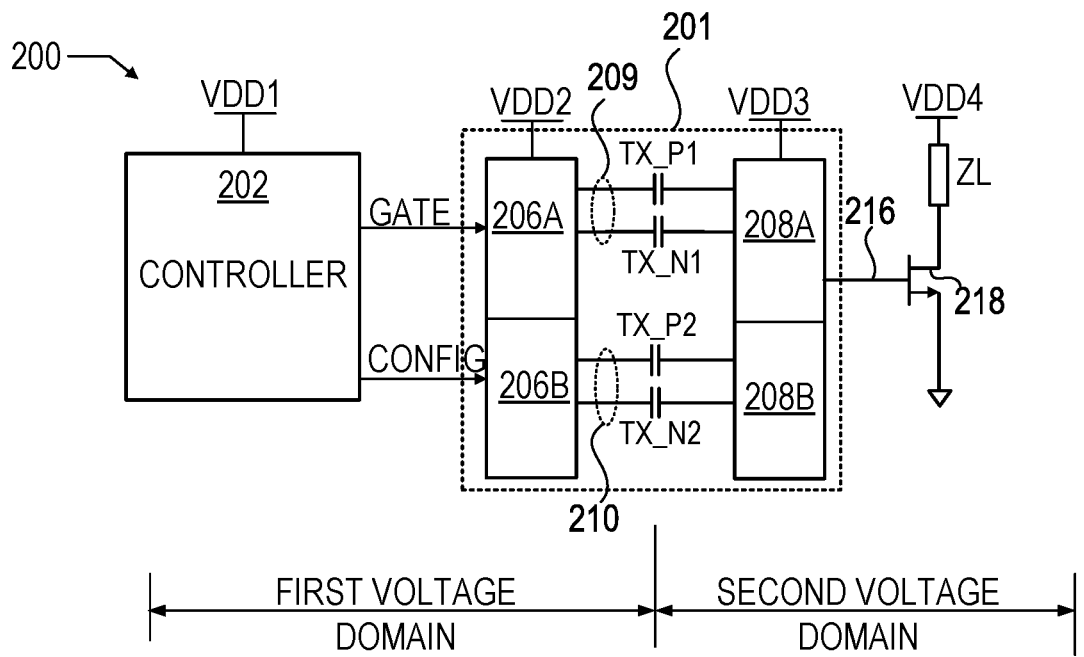
FIG. 2A illustrates a system with an isolated gate driver with two isolation communication channels to transmit gate and configuration information.

A typical CMOS digital isolation solution has a single communication channel 109 as shown in FIG. 1. A second isolation communication channel would normally be required to dynamically transmit information other than gate information, such as status bits, configuration bits, etc., through the isolation barrier. The gate signal is a critical control function that cannot be delayed while configuration information is being sent. Accordingly, referring to FIG. 2A, in order to provide configuration information in addition to the gate information, e.g., dynamic drive strength information, the system 200 utilizes an isolated gate driver 201 with a separate isolation communication channel 210 to send the configuration information. Separate transmitter circuits 206A and 206B transmit the gate and configuration information, respectively, to receiver circuits 208A and 208B on the secondary side utilizing the two isolation communication channels 209 and 210. The transmitter circuit 206A transmits the gate information over the first isolation communication channel 209. The transmitter circuit 206B transmits the configuration information (information other than gate information), over the second communication channel 210. The illustrated differential isolation communication channels 209 and 210 each transmit a positive (TX-P) signal and a negative signal (TX-N). The illustrated isolation communication channels 209 and 210 utilize capacitive isolation although other embodiments may utilize various approaches to isolation such as inductive coupling or optical coupling to communicatively couple the transmit circuits 206A and 206B and the receive circuits 208A and 208B. Thus, the physical implementation of the isolation communication channels may differ in different embodiments.

The secondary side includes driver circuitry (e.g., included in receiver circuit 208A), that generates gate signal 216 based on the GATE signal received from the primary side and provides the gate signal 216 to the gate of device 218. In an example embodiment, the high-power device 218 controls power delivered to a load. Exemplary high-power devices include power metal-oxide-semiconductor field-effect transistors (MOSFETs), insulated-gate bipolar transistors (IGBTs), Gallium-Nitride (GaN) MOSFETs, Silicon-Carbide (SiC) power MOSFETs, and other suitable devices able to deliver high power signals.

In embodiments there are two aspects of the gate signal 216 that are controlled. The receive circuit 208A controls both whether the gate signal is on or off and also controls the drive strength of the gate signal 216 based on configuration information received from the receive circuit 208B.

Thus, as explained above, in one approach the second isolation communication channel carries configuration information. While providing a communication path for configuration information is beneficial, the second communication channel 210 consumes additional power and requires additional silicon area. In addition, package limitations can often prevent the inclusion of a second isolation communication channel. In order to overcome package limitations and the disadvantages due to additional power and area of a second isolation communication channel, while still providing dynamic configuration information, embodiments described herein send configuration information simultaneously with the main digital gate signal over a single isolation communication channel without affecting the main performance requirements of the main digital signal.

Figure 2B:
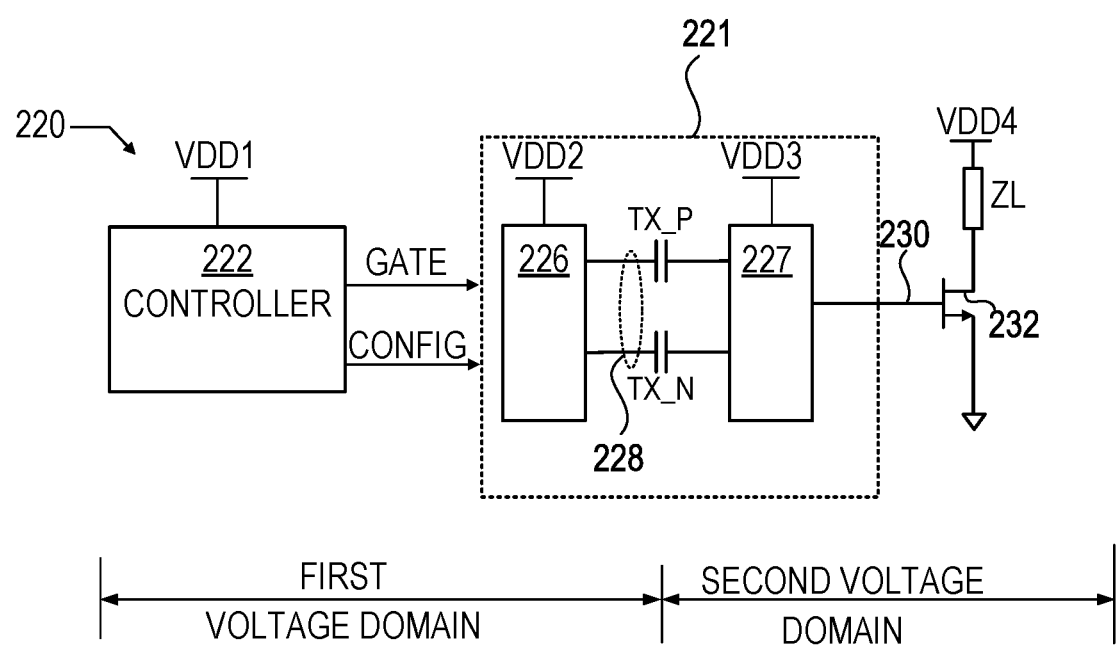
FIG. 2B illustrates an embodiment of an isolated gate driver that transmits two types of information across a single isolation communication channel.

Referring to FIG. 2B, in an exemplary embodiment, the system 220 includes an isolated gate driver 221 that includes a transmitter circuit 226 and a receiver circuit 227 communicatively coupled across an isolation barrier through use of isolation communication channel 228. The system 220 includes a primary side integrated circuit (containing transmitter 226) and a secondary side integrated circuit (containing receiver 227) respectively disposed in first and second voltage domains. In embodiments, transmitter circuit 226 is formed on a first integrated circuit die and receiver circuit 227 is formed on a second integrated circuit die, both of which are attached to a lead frame and include terminals coupled to isolation channel 228 formed on the lead frame and packaged as a single device. In still other embodiments, transmitter circuit 226 and receiver circuit 227 include terminals coupled to the isolation communication channel 228, all of which are formed on an integrated circuit die. In still other embodiments transmitter circuit 226 and receiver circuit 227 are integrated circuits included in a multi-chip module. In embodiments, terminals of the transmitter circuit and receiver circuit are coupled to external elements, e.g., transformers, discrete resistors, and discrete capacitors within the multi-chip module or to terminals of the package of the multi-chip module, and to a package of controller 222.

In embodiments the transmitter circuit 226 and receiver circuit 227 utilize modified on-off keying (OOK) to allow the main digital signal to be sent simultaneously with configuration information over the single isolation communication channel 228. Compared with a two channel implementation shown in FIG. 2A in which one channel is used for the main digital signal and the other channel is used for configuration information, embodiments described herein use a single isolation communication channel thereby consuming less power and utilizing less silicon die area. In an example, as described further herein, the single isolation communication channel 228 carries both gate information for gate signal 230 to drive transistor 232 and drive strength information for the gate signal 230.

Figure 3:
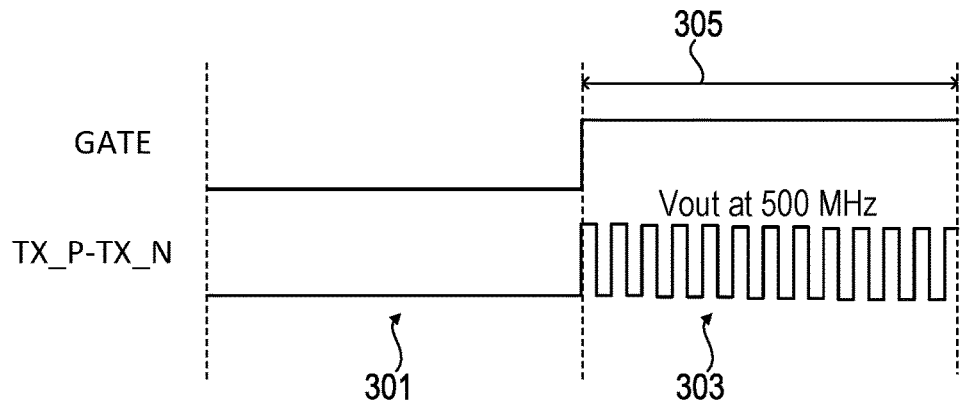
FIG. 3 illustrates traditional on-off keying (OOK).

FIG. 3 illustrates traditional on-off keying (OOK) modulation. OOK is a form of amplitude-shift keying modulation that represents digital data as the presence or absence of a high frequency signal on the communication channel. For example, when the GATE signal (e.g. to drive the gate of transistor 232 in FIG. 2B) is a logic "0", the transmitter transmits a steady state signal (OV) at 301 on the differential isolation channel (TXP-TXN) where TXP is the positive transmitted signal and TXN is the negative transmitted signal for the differential pair. When the GATE signal is a "1", the transmitter transmits a high frequency signal at 303 over the isolation communication channel, e.g., with a frequency of 500 MHz. Thus, the presence of the high frequency represents a binary one, while its absence represents a binary zero. However, traditional OOK can only send one piece of data at a time. In contrast, embodiments described herein transmit the main digital signal (e.g., the gate signal) along with configuration (or other) information over the single isolation communication channel. The main digital signal can be a logical one or a zero and at the same time the configuration information can also be a logical one or zero regardless of the logical value of the main digital signal.

Figure 4:
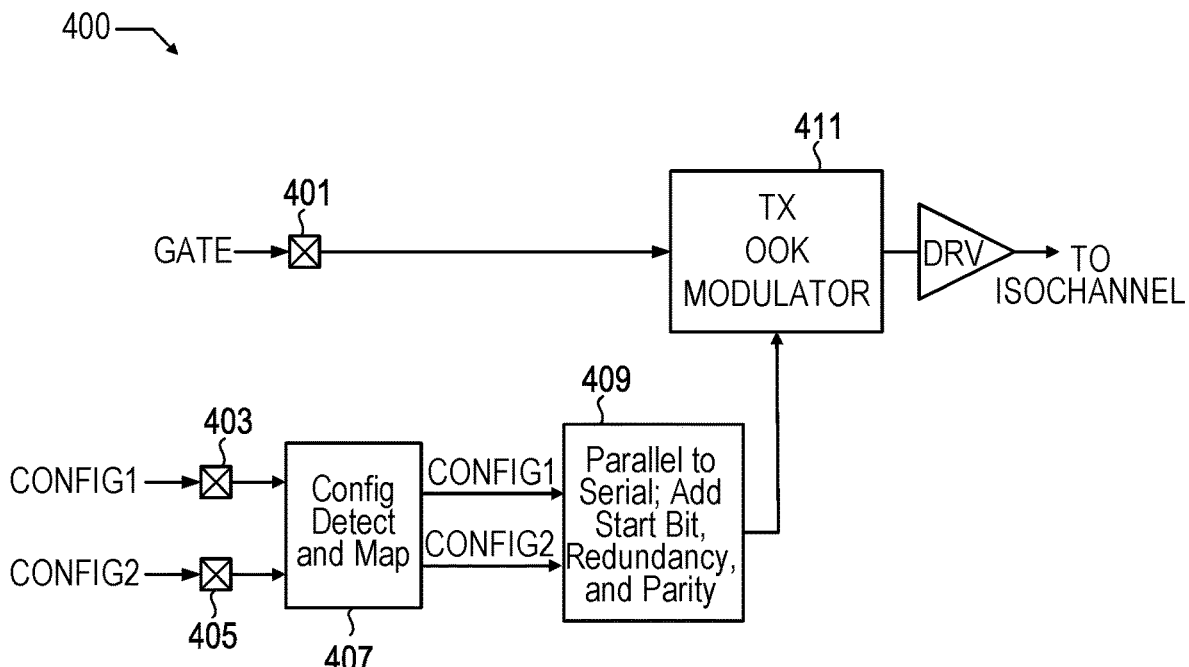
FIG. 4 illustrates an embodiment of a high level block diagram of a transmit side of an isolated gate driver.
Figure 5:
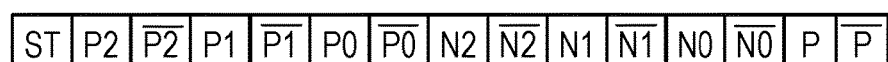
FIG. 5 illustrates a serial word for transmission across an isolation communication channel that provide drive strength information.

FIG. 4 illustrates a high level block diagram of an embodiment of the transmit side 400 of an isolated gate driver. In the illustrated embodiment, gate information 401 from controller 222 (FIG. 2B) provides the information used for the main digital signal—the gate signal. In addition, the transmit side receives configuration information on input terminals 403 and 405. The configuration information may be provided in various forms, such as an analog voltage, a current, a digital voltage, or through resistance values of resistors coupled to the input terminals 403 and 405. The transmitter circuit transmits the configuration information simultaneously with the gate information over a single isolation communication channel. The configuration detect and map circuit 407 receives the parameters (voltage, current, digital value, resistance) present on input terminals 403 and 405 and maps the parameters to a particular drive strength value. In an embodiment, the configuration detect and map logic is made aware of whether to map voltage values, current values, digital values, or resistance values to the drive strength. That may be accomplished through a one-time programmable memory (OTP) that is programmed with the type of parameters being supplied to the isolated gate driver. In an embodiment, the configuration detect and map logic maps the configuration information to a three bit value (P2, P1, P0) for configuration CONFIG. 1 and a three bit value (N2, N1, N0) for CONFG2. In an embodiment, P2, P1, P0 controls the drive strength of the gate signal generated by PFETs when the gate signal is pulled up and N2, N1, NO controls the drive strength of the gate signal generated NFETs when the gate signal is pulled down. The configuration detect and map circuit 307 supplies the three bit digital values to the parallel to serial logic circuit 409 that converts the parallel bits to a serial word. In an embodiment, the parallel to serial logic circuit 409 also adds a start bit, parity, and redundancy to the serial word, as shown in FIG. 5, for transmission across the isolation communication channel. For example, bit (P2) and its complement ($\overline{P2}$) are transmitted over the isolation communication channel. Other embodiments add additional parity bits to provide for multi-bit error correction or for other error checking techniques. Each serial bit is transmitted on the isolation communication channel along with a value of the GATE signal. A typical serial bit time is 1 or 2 μs but other embodiments use a bit time of a different length. Logic 409 supplies the serial word to the transmit OOK modulation circuit 411, which is described further herein. The transmit OOK modulator also receives the gate signal from input terminal 401.

Figures 6, 7:
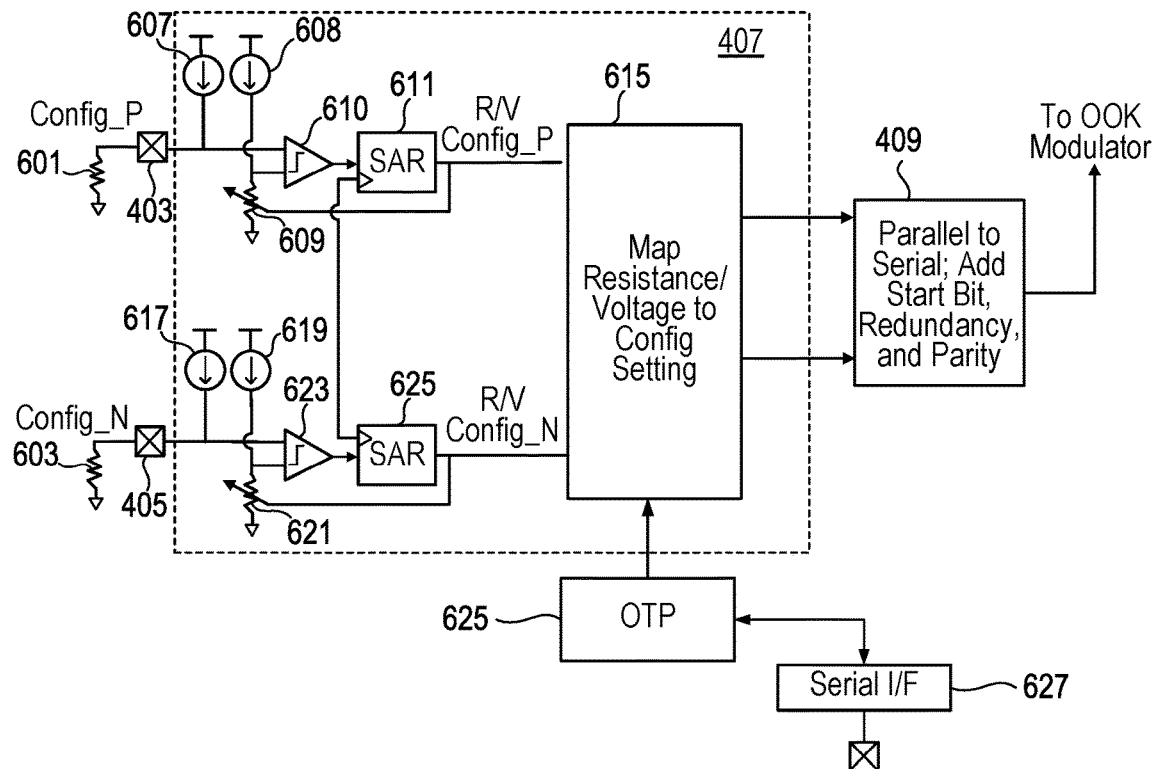
FIG. 6 illustrates an embodiment of a configuration detect and map circuit.
FIG. 7 illustrates an embodiment of mapping configuration parameters to drive current strength.

FIGS. 6 and 7 illustrate additional details of the configuration detect and mapping circuit 401. In an embodiment, the resistance values of resistors 601 and 603 coupled to input terminals 403 and 405 determine the drive current strength of the gate signals. The current from current sources 607 and 608 cause voltages across resistor 601 and variable resistor 609, and comparator 610 receives the two voltages. The successive approximation register (SAR) 611 adjusts the variable resistor 609 until the comparator 610 indicates the voltages on its inputs are equal, e.g., when the comparator output changes polarity, thereby indicating that the SAR setting corresponds to the value of the external resistor 601. Mapping logic 615 maps the final SAR value (or equivalent resistance value) to a three bit code indicating drive current strength as explained in more detail in the example of FIG. 7. The configuration information on input terminal 405 is similarly determined using current sources 617 and 619, variable resistor 621, comparator 623, and SAR 625. SAR 625 is adjusted until the voltages at the inputs of comparator 623 are the same, thereby indicating the value of external resistor 603.

In another embodiment a voltage level is supplied on input terminals 403 and 405 to specify the configuration information rather than using resistors 601 and 603. In such an embodiment, rather than connecting resistors, the controller 222 (see FIG. 2B) supplies a voltage to the input terminals from, e.g., a digital to analog converter (DAC) in the controller. To operate in the "analog voltage" mode, the current source 607 is turned off and current source 608 supplies a known current to variable resistor 609. The SAR 611 adjusts the variable resistance until the comparator 610 indicates the voltages at its inputs are equal. The voltage across the variable resistor 609 is supplied to the mapping logic or the SAR output (the variable resistance setting) is interpreted as an estimate of the voltage level seen at terminal 403. The detection of the voltage on input terminal 405 is similarly accomplished. The current source 617 is turned off and current source 619 supplies a known current. SAR 625 adjusts the variable resistance 621 until the comparator 623 indicates the voltages at its inputs are equal. The voltage across the variable resistor 621 (or the SAR output) is supplied to the mapping logic 615, which interprets the SAR setting as an estimate of the voltage seen at terminal 405.

In still another mode of operation, rather than resistors or analog voltages being applied to the input terminals receiving configuration information, a digital value is applied to the input terminals allowing the selection of two different values for the configuration information on each input terminal. In an embodiment of "digital" mode, the current source 607 is turned off and the current source 608 supplies a current to a fixed resistance value of the variable resistor 609 that causes a threshold voltage value to be supplied to the comparator. That threshold voltage distinguishes a logic 1 from a logic 0. The comparator output may be supplied directly to the mapping logic 615. In other digital embodiments, a separate comparator is used to determine a logic 0 or 1. In still other embodiments, one or more of terminals 403 and 405 function as a serial input port and the configuration is supplied in a digital word allowing greater selection of configuration settings. The circuitry associated with input terminal 405 operates in digital mode in a similar manner to the operation of the circuits described with relation in input terminal 403. Many other circuits can be used to determine voltages, resistance, current, capacitance, or other parameters values on terminal 403 and 405. The circuits shown in FIG. 6 are examples and many other circuits can be used to receive and determine parameter values that would be apparent to those of skill in the art.

FIG. 7 illustrates an embodiment of the mapping functionality, which maps resistance, analog voltage, or digital values to a particular configuration value. In an embodiment, the mode of operation (analog resistance, analog voltage, digital) is programmed into a one time programmable memory 625, e.g., through a interface 627. In other embodiments the mode of operation may be programmed into the other kinds of memory in the transmitter integrated circuit, e.g., non-volatile memory (NVM). With reference to the embodiment of FIG. 7, in "analog resistance" mode 701, resistance values map to configuration states S0-S7, represented by 3 bits. The three bits map to eight different drive current strengths shown as drive current strength percentages 705. FIG. 7 shows that the various configuration states S0-S7 map to a particular percentage drive current strengths ranging from 8.75% to 100% of the maximum drive current. For example, a resistance near the value of 4.42 kΩ (state S2) maps to a 17.5% drive current strength. Thus, 17.5% of a maximum drive current strength is utilized to drive at least one value of the gate signal. The particular percentages are only examples and other embodiments may utilize different percentages of drive current strength and a different number of configuration bits. Note that the resistance values are illustrative and other resistance values may be used in other embodiments.

The table in FIG. 7 also shows how in "analog voltage" mode voltage levels 703 on the input terminals map to the different configuration states. For example, a voltage level near 221 mV (state S2) maps to a drive current strength percentage of 17.5%. In voltage mode, a controller (e.g., controller 222 in FIG. 2B) supplies the voltage to the input terminal. While an analog voltage mode is shown, other embodiments use an analog current and map analog current values to the configuration states.

In "digital mode" an external controller, e.g., controller 222 (FIG. 2B) drives the configuration terminals with digital signals and states S0 and S8 are mapped to arbitrary drive strength values shown as p/nfet_str_low and p/nfet_str_high. For example a digital "0" on pin 403 maps to pfet_str_low and a digital "1" on pin 403 maps to pfet_str_high, and a digital "0" on pin 405 maps to nfet_str_low and a digital "1" on pin 405 maps to nfet_str_high. PFET and NFET transistors (see, e.g., FIG. 18) are used to generate the gate drive signal. In an embodiment, the drive strength values for digital mode are programmed into OTP (or NVM). The particular mappings for resistance, voltage, and percentages may also be programmed into the memory (OTP, NVM, or other) used by the mapping logic 615.

In an embodiment, the configuration terminals also provide a disable feature to disable the transmitter. A bit in memory (OTP, NVM, or other) is set to indicate the disable feature is enabled. The disable feature disables the transmit signal path in the transmit circuit if the state S8 is received in either the analog (resistance or voltage) or digital mode. The disable feature may cause 0V to be coupled to the transmit signal path or otherwise disable transmissions. In analog voltage mode a voltage >850 mV maps to S8 and in analog resistance mode a high impedance (hiZ) value maps to S8. In digital mode a logical 1 indicates the S8 state and thus disable mode. With the disable feature enabled, the digital mode only provides a single drive current strength value in S0. With this disable feature, a single pin can be used the control both the drive strength and enable/disable function of the transmitter, thus allowing more features in a smaller pin count package.

In an embodiment, an additional bit(s) in memory (OTP, NVM, or other) indicates use of a single pin (rather than two) to indicate signal strength. In an embodiment, the additional bit always indicates a particular input terminal is to be used, e.g., if the single pin bit is set, always use input terminal 403. In other embodiments, additional bits may be used in single pin mode to indicate which input terminal is the "single pin." Thus, in the single pin mode the drive strength information from only one of the configuration pins is used to generate both P2, P1, P0 and N2, N1, N0. With the single pin mapping to both P and N functions, drive strength control can be utilized in reduced pin count packages where only a single pin is available for strength control function. Embodiment may include capability to support any or all of the several modes of operation, including analog/digital, disable/not disable, and single pin/not single pin.

Figure 8:
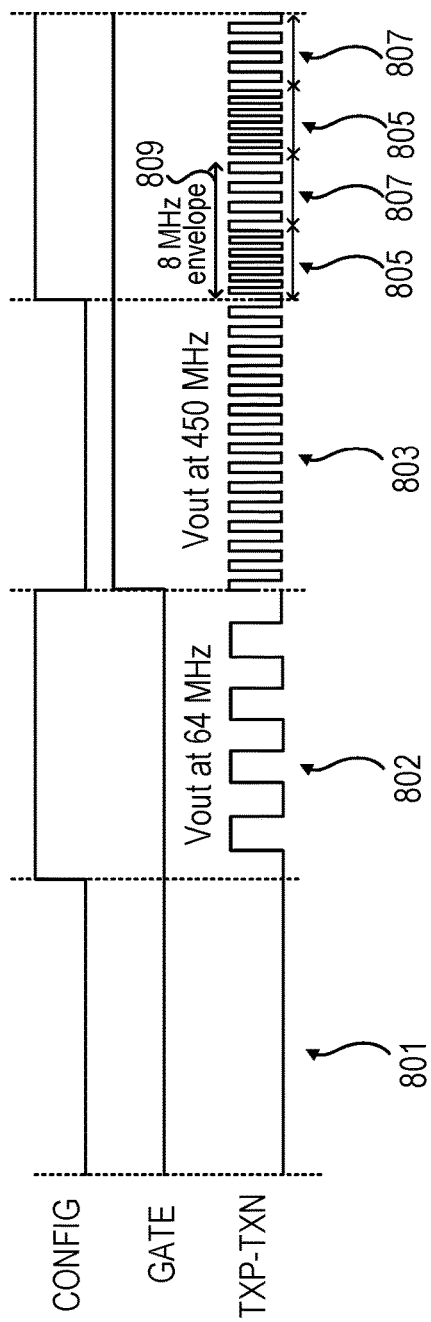
FIG. 8 illustrates an embodiment of a modulation scheme that allows sending configuration information and gate information simultaneously.
Figure 9:
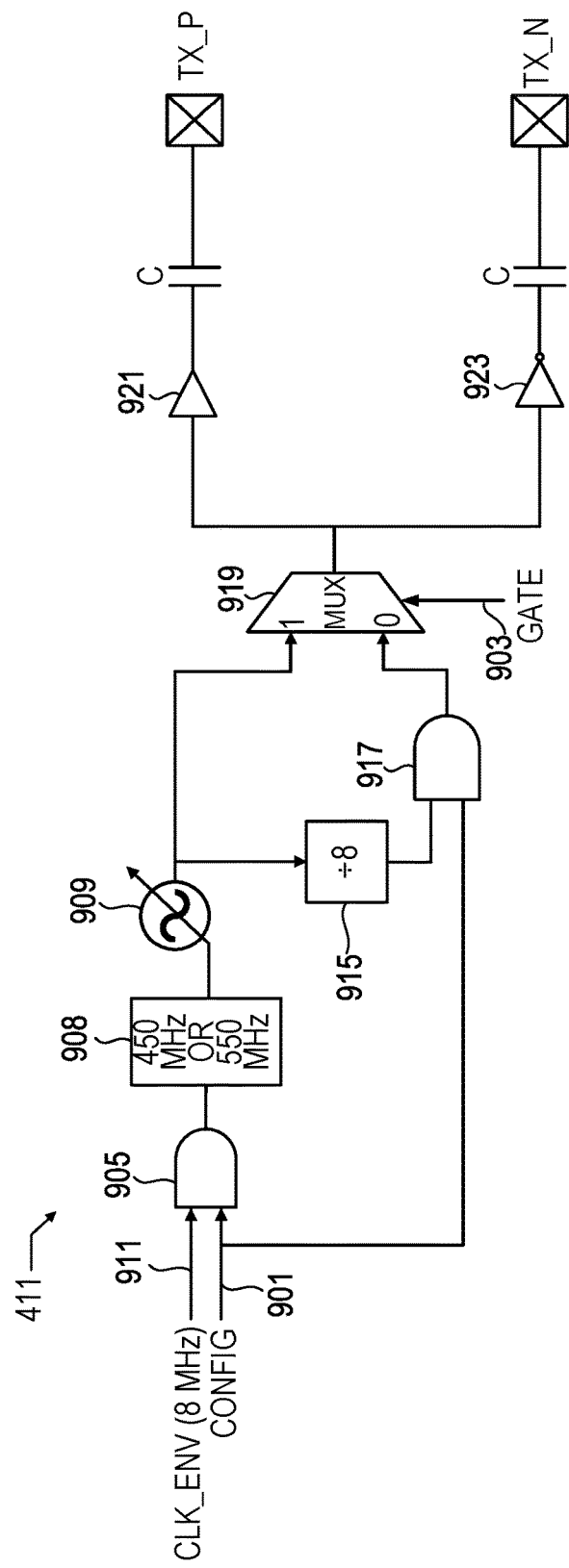
FIG. 9 illustrates a high level diagram of a modified OOK modulator.

Referring again to FIG. 6, once mapping is complete, the parallel data is converted to serial in logic 409 and a start bit, redundancy (to the extent desired) and parity is added for serial transmission across the isolation communication. The serial data is supplied to the OOK modulator 411, which modulates the serial configuration data and the gate signal. FIGS. 8 and 9 illustrates operation of the OOK modulator.

FIG. 8 illustrates an embodiment of the modulation scheme that allows sending both configuration information and gate information simultaneously. To transmit configuration information having a value of CONFIG=0, with GATE=0, a constant voltage is sent as shown at 801. For CONFIG=1 and GATE=0 the signal is modulated at a frequency of 64 MHz as shown at 802. For CONFIG=0 and GATE=1, as shown at 803, the signal is frequency modulated at the OOK frequency. In an embodiment the OOK frequency is 450 MHz. The OOK frequency should be high enough to readily distinguish from the lower frequency signal when CONFIG=1 and GATE=0. Finally, for GATE=1 and CONFIG=1, the signal is frequency modulated at two frequencies during the bit time with a first frequency shown at 805 and a second frequency shown at 807. The frequencies are contained in envelope 809. In an embodiment, the frequency shown at 807 is 450 MHz and the frequency shown in 805 is 550 MHz and the envelope 809 is an 8 MHz envelope. Thus, the modulator is responsive to the GATE signal to provide straight OOK modulation (a 0 or 450 MHz signal) with the CONFIG signal at 0 and provides an adjustment to the OOK signal with the CONFIG signal=1 (~64 MHz or 450/550 MHz). Note that the frequency deviation of the transmitted signal is substantially larger in response to changes in the GATE signal as compared to changes in the CONFIG signal. For example, changes in the GATE signal cause the modulation frequency to change from 0 to 450 MHz. In contrast, changes in the CONFIG signal, assuming the GATE signal is constant, cause the modulation frequency to change from 0 to 64 MHz or from 450 MHz to 550 MHz. This frequency separation helps ensure an accurate demodulation of the GATE signal.

FIG. 9 illustrates an embodiment of the OOK modulator 411. The modulated signal generated is based on the values of the CONFIG signal 901 and the GATE signal 903 to generate the signal shown in FIG. 8 that represents four states (two binary values for CONFIG and two binary values for GATE). The AND gate 905 receives the CONFIG signal 901 and the envelope signal 911. Oscillator control logic 908 receives the output of AND gate 905 and controls whether oscillator 909 generates a 450 MHz signal or a 550 MHz signal. An output of 0 from AND gate 905 causes the oscillator 909 to generate a 450 MHz signal and an output of 1 causes the oscillator to generate a 550 MHz signal. The oscillator 909 may be implemented as a ring oscillator with different taps for different frequencies or different supply voltages or currents, an LC oscillator with adjustable capacitance, or any other suitable oscillator. With CONFIG=0, the oscillator 909 generates a 450 MHz signal and with CONFIG=1 the oscillator 909 generates the 450 MHz signal and the 550 MHz signal at a rate determine by the frequency of the envelope signal 911. For example, with an 8 MHz envelope signal, the 450 MHz signal and the 550 MHz signals repeat at an 8 MHz rate as shown in FIG. 8. The divider circuit 915 divides the oscillator output signal by 8 or other appropriate divide value to readily distinguish the lower frequency signal from the 450/550 MHz signal. With CONFIG=0, AND gate 917 supplies a 0 to multiplexer 919. Multiplexer 919 receives an input signal from the oscillator 909 and another input signal from AND gate 917. The value of the GATE signal selects the input provided on the output of multiplexer 919. With GATE=1, the multiplexer selects the oscillator output signal (450 MHz or 450/550 MHz) as the multiplexer output signal depending on the value of CONFIG. With GATE=0, the multiplexer selects the output of AND gate 917, corresponding to the signals shown 801 or 802. AND gate 917 supplies either a 0, with CONFIG=0 or the output of divider 915 with CONFIG=1. Note that in the embodiment of FIG. 9, with CONFIG=1, and GATE=0, the divider divides the oscillator output that varies according to the envelope signal. Thus, the divide by 8 signal is 450/8 MHz and 550/8 MHz with the envelope signal 911 determining the rate of change between the two frequencies. In other embodiments, the GATE signal is also supplied to control logic 908 and having GATE=0 and CONFIG=1 and the control logic 908 forces the oscillator output to be fixed at either 450 MHz or 550 MHz in that state and thus the frequency at 802 to be fixed at 56.25 MHz or 68.75 MHz. The 64 MHz signal represents a suitable frequency for that particular state with GATE=0 and CONFIG=1 but the frequency can be higher, lower, or varying according to the particular embodiment. The signal from multiplexer 919 is then supplied to drivers 921 and 923 and transmitted over the isolation communication channel. The transmitted signal is then received by the receiver coupled to the isolation communication channel, and is sent to a demodulator to recover the GATE signal and the CONFIG signal. The GATE signal controls the transistor coupled to the receiver circuit and the CONFIG information is de-serialized to recover the configuration bits, which are then used, e.g., to control the drive strength of the GATE signal.

The drive strength aspects of the modulator shown in FIG. 9 is easily disabled, e.g., by setting CONFIG 901 to 0, and then the OOK signal returns to a traditional OOK modulation with a 1 indicated by a 450 MHz signal and a 0 indicated by a steady state voltage such as 0V. In that way, in applications where no drive strength signal is provided, the modified OOK modulator can operate as a standard OOK modulator. In an embodiment, the configuration of this modified OOK modulator into a standard OOK modulator is implemented by OTP control in a similar way as described in other aspects of embodiments described herein.

Another embodiment waits until GATE=1 to transmit configuration information. The OOK signal is frequency modulated to represent CONFIG=1 (or 0) as shown at 805 and 807 and the OOK signal is a fixed frequency as shown at 803 to represent a CONFIG=0 (or 1). That approach has the benefits of being simpler but limits the transition to only when the main signal (e.g., GATE) is one. Also, instead of frequency modulation, other embodiments pulse width modulate the OOK signal when GATE=1, but that approach becomes more difficult for high OOK frequencies in which the pulse with is small.

Various other modulation schemes can be used. For example, four frequencies can be used to represent the four states represented by GATE and CONFIG. In some of these embodiments, the GATE signal changing causes a much larger frequency deviation at the output of the modulator than changes in the CONFIG signal. In this way, the integrity of the GATE signal could be maintained while only relatively small frequency changes caused by the CONFIG signal would only cause minor changes to the demodulation of the GATE signal. Alternatively, various patterns of 1s and 0s may be used during a bit time to represent different values.

Figure 10:
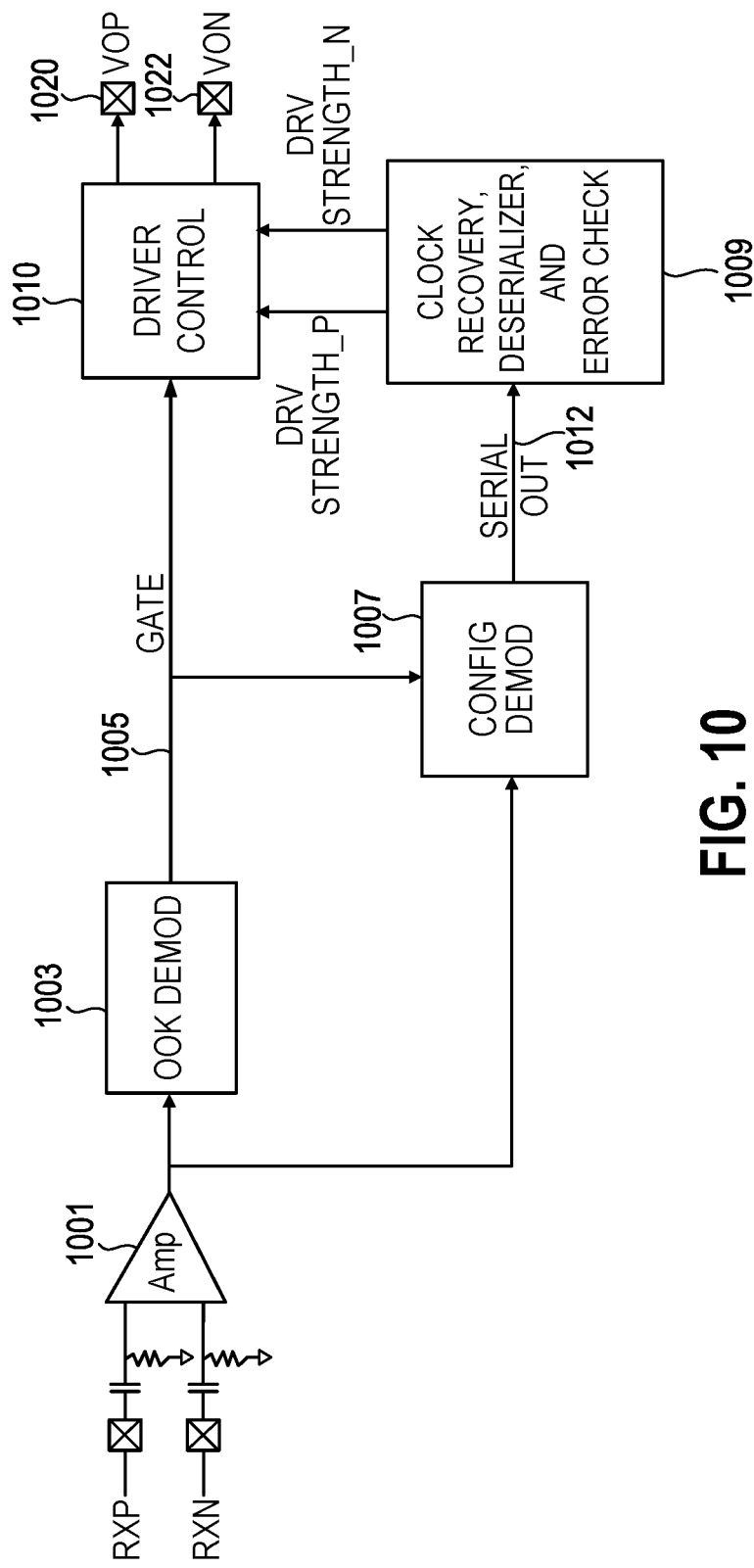
FIG. 10 illustrates a block diagram of an embodiment of a receive circuit.

FIG. 10 illustrates a block diagram of portions of an embodiment of the receiver 227 shown in FIG. 2B. The receiver receives a differential signal that was transmitted over the isolation communication channel and is received as the differential signals RXP and RXN. Those signals are amplified in one or more amplifiers 1001 and supplied to an OOK demodulator 1003 to demodulate gate information from the received differential signal and supply the gate signal 1005. The gate signal and the received signal, after amplification, are supplied to a configuration demodulation path 1007 that extracts the configuration information from the received differential signal and supplies the configuration information to the clock recovery, deserializer, and error check circuit 1009. The clock recovery, deserializer, and error check circuit 1009 converts the serial data stream received over the isolation communication channel to a parallel word of configuration information, e.g., 3 bits, to apply as drive strength signals to the driver control logic 1010. Thus, the clock recovery, deserializer, and error check circuit 1009 recovers a clock signal to sample the serial out data 1012 from the configuration demodulation path 1007, recreates P2, P1, P0 and N2, N1, and N0, checks the parity bits, redundancy bits, or otherwise performs the error checking to ensure the data is correct before updating the configuration setting of the driver control circuit 1010. If errors are found, the drive strength values are not updated. Other configuration settings may also be controlled by the configuration information transmitted. For example, the configuration information can specify the type of error reporting desired, default values for drive strength, or turn on and off times for the high-power transistor. In the embodiment of FIG. 10 two output terminals 1020 and 1022 are used to supply the turn on and turn off signals for the gate signal, which are combined externally to drive the power transistor. The VOP pin 1020 provides the positive drive current to turn on the power transistor and the VON pin 1022 provides the sinking current to turn off the power transistor. Other embodiments utilize a single output terminal for the gate signal. The strengths of the drive currents provided by the driver control logic 1010 are controlled by the configuration information.

Figure 11:
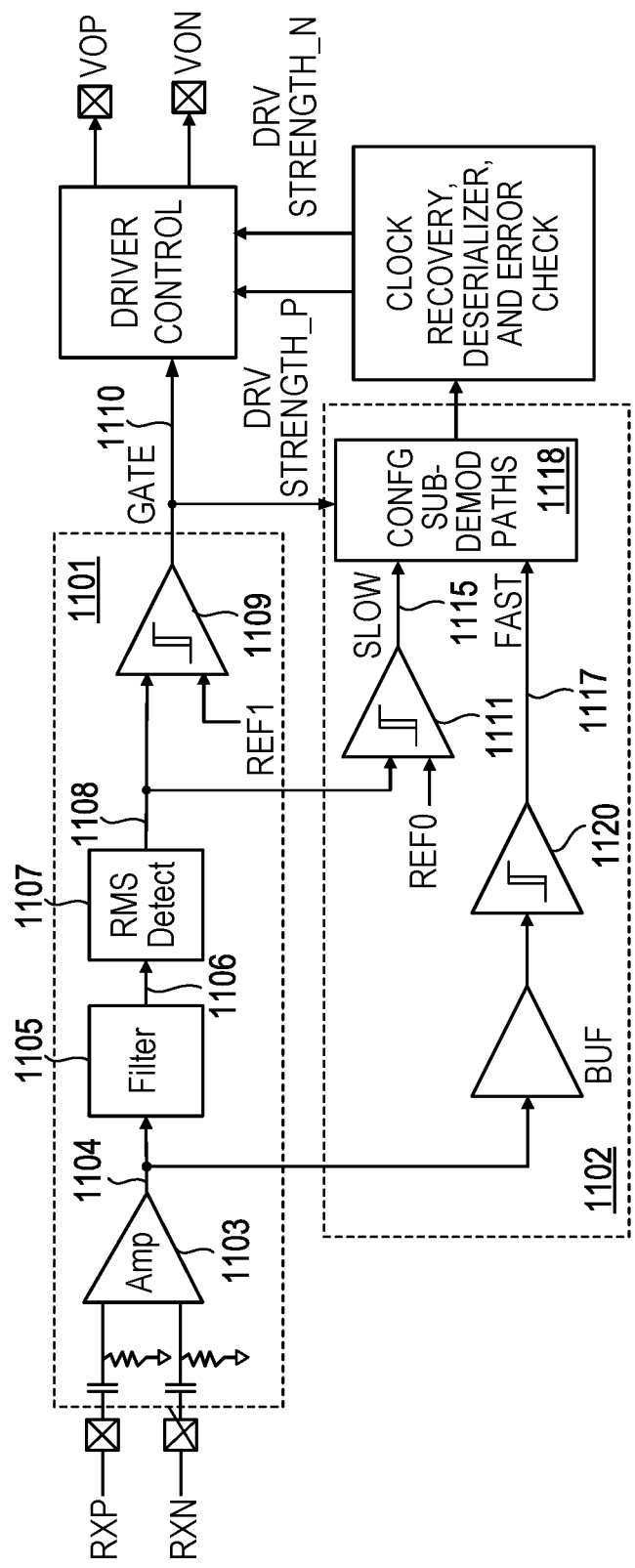
FIG. 11 illustrates additional aspects of an embodiment of the demodulator portion of the receive circuit.
Figure 12:
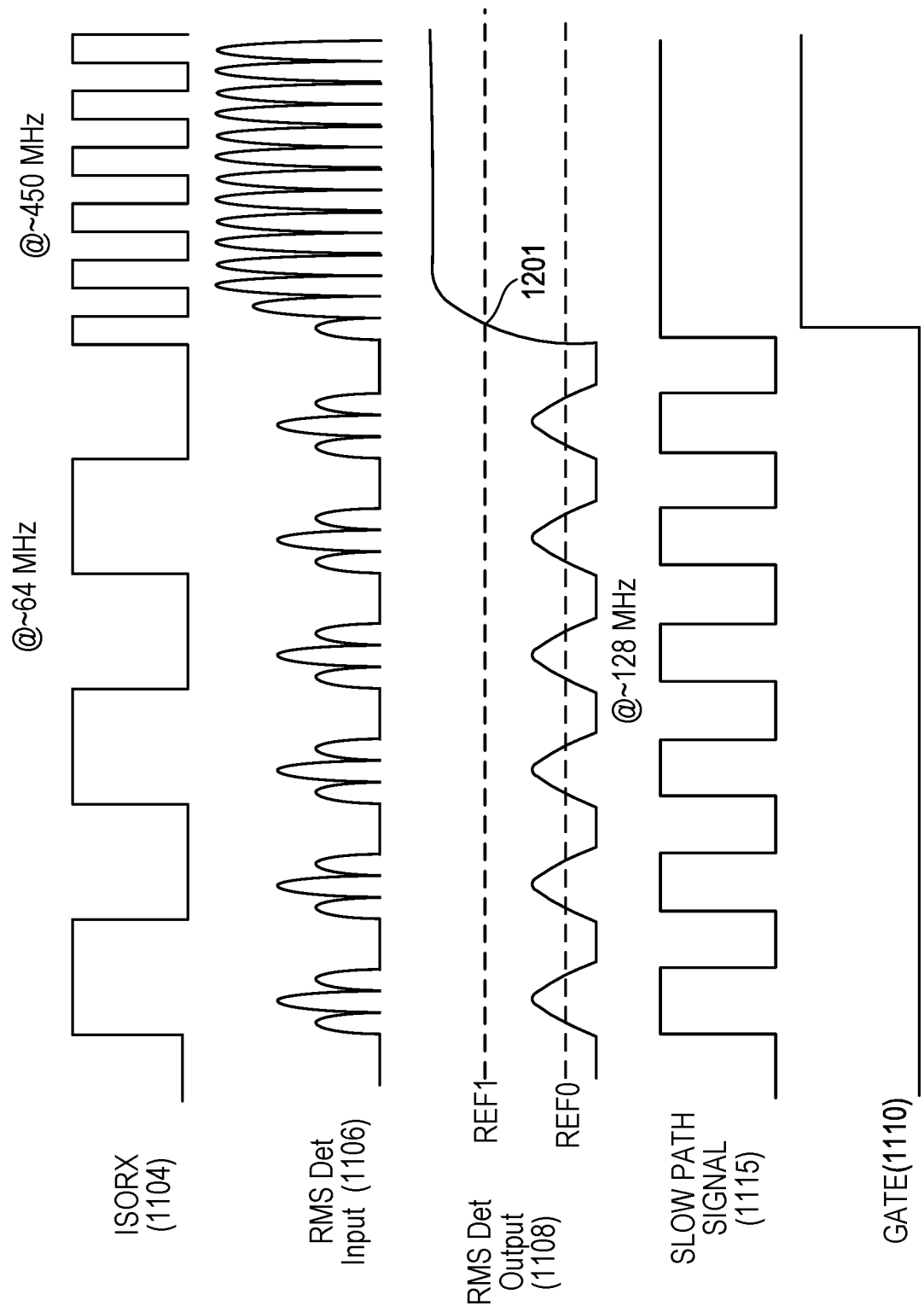
FIG. 12 illustrates waveforms showing operation of the demodulator portion.

FIG. 11 illustrates additional details of an embodiment of the demodulator in the receive circuit. The demodulator includes a gate demodulation path 1101 and a configuration demodulation path 1102. FIG. 12 illustrates example waveforms involved in the demodulation of the transmitted signal. In the example waveforms of FIG. 12 ISORX 1104, the received signal after amplification, starts at a state representing CONFIG=1 and GATE=0 (oscillating at 64 MHz) and then changes to CONFIG=0 and GATE=1 (oscillating at 450 MHz). With reference to FIGS. 11 and 12, the amplifier 1103 supplies an amplifier output ISORX 1104 to a filter 1105. In an embodiment, filter 1105 is implemented as a bandpass filter with a center frequency around 500 MHz, and a bandwidth such that it can pass 450 MHz and 550 MHz, but will reject other frequencies such as 64 MHz, and those frequencies associated with noise in the system. The filter 1105 supplies a filter output 1106 as an input to a root mean square (RMS) detect circuit 1107. The RMS detect circuit 1105 detects the energy in the received signal and supplies an RMS output signal 1108, to comparator 1109 and comparator 1111. The comparator 1109 compares the RMS detect output 1108 to a reference voltage REF1 shown in FIG. 12. In FIG. 12, the RMS output 1108 is below REF1 (when ISORX oscillates at 64 MHz) until 1201 at which time the RMS output signal 1108 goes above the voltage threshold REF1 indicating the RMS value corresponds to an oscillation value of at least 450 MHz. At that time the GATE signal 1110 goes from 0 to 1. Note that if the oscillation was 450/550 MHz (GATE=1, CONFIG=1), the GATE signal supplied by comparator 1109 would still be a 1 as the RMS detect output 1108 would still be above REF1. Thus, gate demodulation path 1101 functions as an OOK demodulator and looks for oscillations at or above a certain frequency (450 Mhz) and ignores oscillations below that frequency, thus ignoring the modifications to the OOK signal caused by CONFIG=1, when GATE=0, resulting in ISORX oscillating at approximately 64 MHz. When the RMS detect output rise above REF1, the GATE signal 1110 from the comparator 1109 goes to one and when the RMS detect output falls below REF1, the gate signal 1110 goes to 0.

In one part of the configuration demodulation path, comparator 1111 compares the output 1108 of the RMS detect circuit 1107 to the voltage threshold REF0. As shown in FIG. 12 the compare results in an oscillating signal 1115 at 128 MHz when ISORX is oscillating at 64 MHz (GATE=0 and CONFIG=1). When ISORX is 0, the slow path signal is zero and when ISORX is 450 MHz or 450/550 MHz, the slow path signal 1115 is a "1". The comparator 1111 supplies the slow path signal 1115 to the digital demodulation block 1118, which includes sub-demodulation paths described further herein.

The fast path signal 1117 of the configuration demodulation path comes from the output 1104 of the amplifier 1103 and the fast path signal is supplied (with the 8 MHz envelope present when GATE=1 and CONFIG=1 and without the envelope present when GATE=1 and CONFIG=0) to the digital demodulation block 1118. Schmitt trigger 1120 converts the output of the amplifier 1103 (after a buffer circuit) to a digital value for the digital demodulation block 1118. Note that some circuits in the gate demodulation path and the configuration demodulation path are shared.

Figure 13:
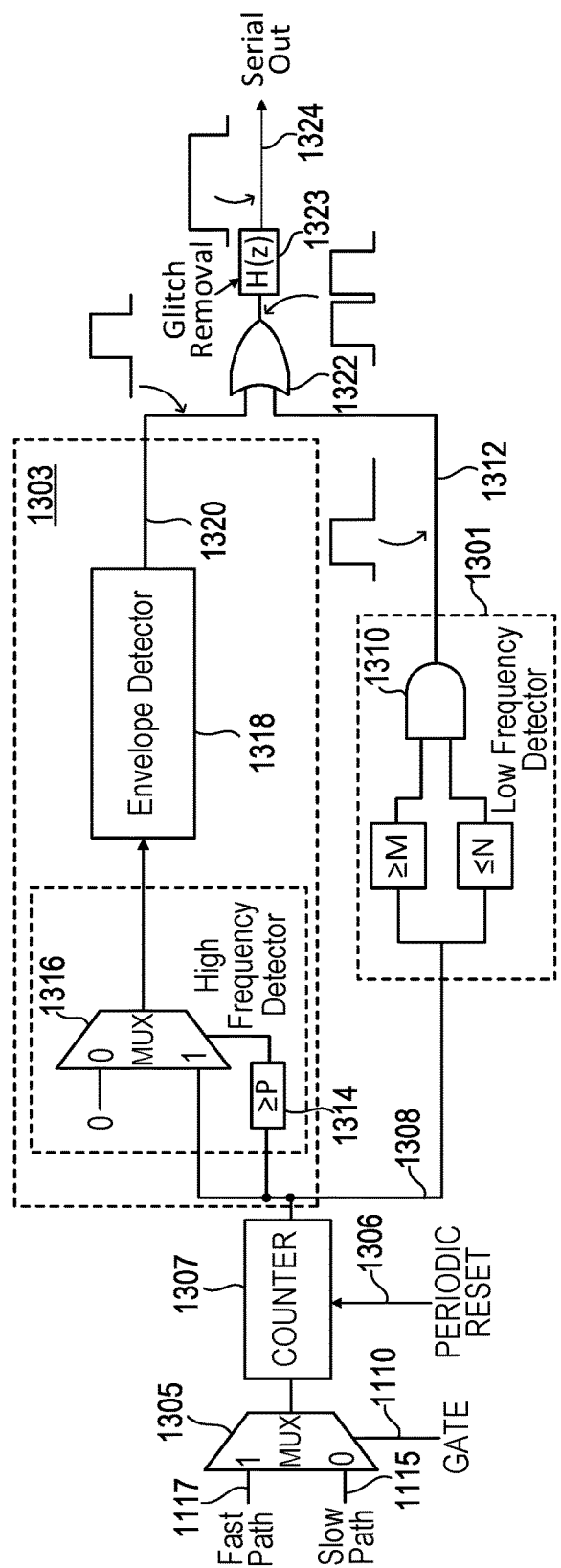
FIG. 13 illustrates the fast and slow paths of the configuration demodulation according to an embodiment.

FIG. 13 illustrates additional details of sub-demodulation paths 1301 (slow path) and 1303 (fast path) of the configuration demodulation path and some common elements in the configuration demodulation path including the selector circuit 1305 and the counter 1307. Selector circuit 1305 selects the fast path signal or the slow path signal according to the value of the GATE signal 1110. If the GATE signal is "1", implying the transmitted signal is at least 450 MHz, the selector circuit 1305 selects the fast path signal 1117. If the GATE signal is "0", implying the transmitted signal is ~64 MHz (varying between 56.25 MHz and 68.75 MHz in the embodiment illustrated in FIG. 9), or lower in frequency, the selector circuit selects the slow path signal 1115. The ripple counter 1307 counts the number of pulses from the fast path signal or slow path signal and supplies the count value to the fast path sub-demodulation path 1303 and to the slow path sub-demodulation path. The counter 1307 is periodically reset by reset signal 1306. The slow path sub-demodulation path 1301 receives the count value 1308 and compares the count value to integer values to see if the count value is within a frequency range bounded by the integer values M and N. If the count value is above a minimum value M and below a maximum value N, then the frequency of the slow path signal is within the frequency range (e.g., a frequency range including 128 MHz) and the output 1312 from AND gate 1310 goes to a "1". If count value is below M, e.g., CONFIG=0 then AND gate 1310 supplies a "0" on output 1312. If the count value is above N, indicating the slow path signal has a higher frequency than, e.g., ~128 MHz, then AND gate 1310 supplies a "0".

The fast path sub-demodulation path 1303 receives the count value at compare logic 1314 and selector circuit 1316. The compare logic 1314 determines if the count value is greater than or equal to an integer P, thereby indicating the frequency of the transmitted signal (and the fast path signal) is above a predetermined frequency, e.g. 450 MHz. If the counter value 1308 is less than P, the selector circuit 1316 selects 0 and otherwise selects the count value. The envelope detector 1318 detects the presence of an envelope, e.g., the 8 MHz envelope shown in FIG. 8. In an embodiment the envelope detector 1318 implements a single frequency of a discrete Fourier transform (DFT) to find the energy at 8 MHz and detect the envelope. Thus, if the count value is changing between periodic resets based on a 450 MHz/550 MHz transmitted signal (GATE=1, CONFIG=1), the envelope is detected and the output of the envelope detector goes to "1". If on the other hand, no envelope is detected, e.g., the transmitted signal is 450 MHz 1(GATE=1, CONFIG=0) the output of the envelope detector is "0". The output 1320 of the envelope detector is combined in OR gate 1322 with the output 1312 of AND gate 1310. A filter, e.g., a finite impulse response (FIR) filter 1323 removes glitches from the output of OR gate 1320 and supplies a serial output 1324. Additional filters, e.g., additional FIR filters, may be used in the fast sub-demodulation path and slow sub-demodulation path that are not shown for ease of illustration. The compare logic compares the count value from counter 1307 to M, N, and P in an embodiment using 4 samples per 8 MHz envelope (using a 32 MHz internal clock signal) in the fast path and a similar number of counts are obtained for the 128 MHz input to the slow path. In an embodiment, the comparison is made only for the selected path (active path) with the non-selected path output to OR gate 1322 being forced to zero. The idea is that only one of the slow and fast paths is active at any point in time.

Figure 14:
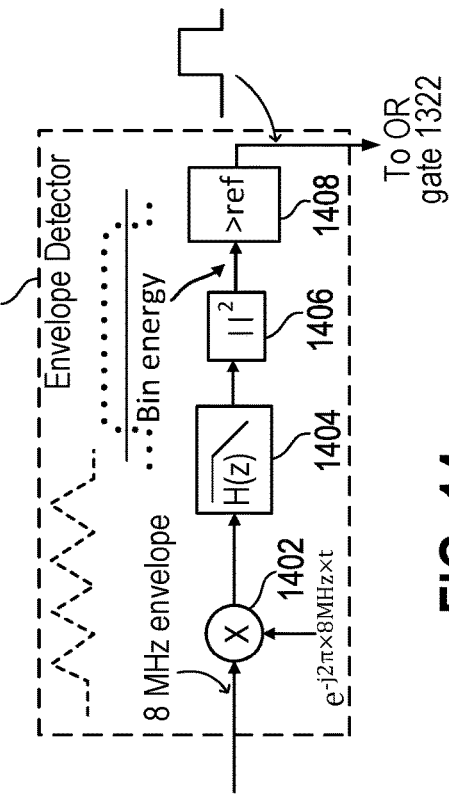
FIG. 14 illustrates additional details of an embodiment of the envelope detector.

FIG. 14 illustrates additional details of the envelope detector 1318. The DFT 1402 supplies a filter 1404. The filter output is squared in 1406 and comparator 1408 compares the bin energy from 1406 to a reference value corresponding to the bin energy that would be present if the envelope were present at a minimum amplitude value. If the bin energy is greater than the reference, the envelope detector supplies a "1" and if the bin energy is not greater than the reference, the envelope detector supplies a "0".

Figure 15:
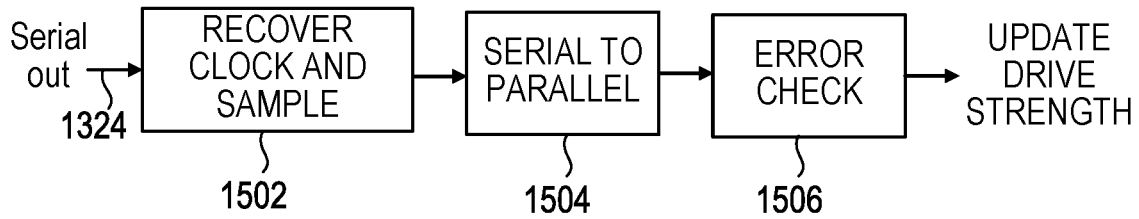
FIG. 15 illustrates processing of the serial out data from the configuration demodulator.

Referring to FIG. 15, the serial output 1324 from the configuration demodulator is supplied to the clock recovery, deserializer, and error check circuit 1009 (see FIG. 10) that samples the serial output in sample circuit 1502, recreates the configuration information including the start bit, P2, P1, P0, N2, N1, N0, and parity bits and any other redundancy bits in serial to parallel block 1504. Once the transmitted word is recovered, the error check logic 1506 checks for errors, e.g., parity errors. If no errors are detected, the START bit, redundant bits, and parity bit(s) are removed and the recovered CONFIG values update the driver strength (or other configuration settings) in the drive control block.

Figure 16:
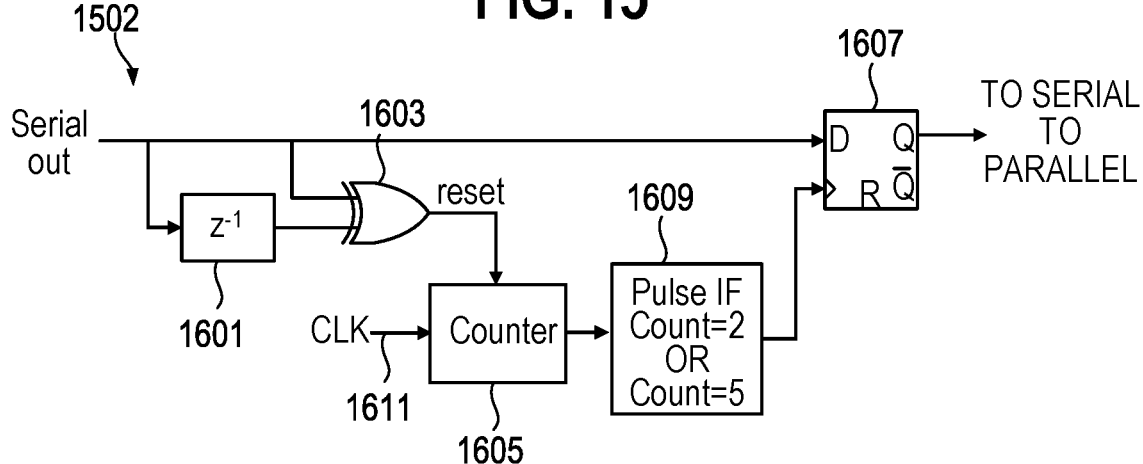
FIG. 16 illustrates a sampling circuit to sample the data from the configuration demodulator.

FIG. 16 illustrates an embodiment of sample logic 1502. The sample clock signal is recovered from transitions of serial out and delayed to cause the sampling to occur in the middle of a serial out bit. A transition detector (1 to 0 or 0 to 1) can be used to generate a sampling pulse from sequential bits having a transition. The lack of transitions in sequential bits, e.g., sequential 1s or 0s, requires another way to determine a sample time. The delay block 1601 delays the serial output and XOR gate 1603 compares the delayed serial output to the current serial output. If the bits are different, indicating at transition, the counter 1605 resets. Flip-flop 1607 receives the current serial out bit on its D input. The pulse logic 1609 pulses the clock of flip-flop 1607 when the counter equals 2. That places the pulse two clock cycles of counter 1605 after the transition. The counter's clock 1611 has a period such that two cycles of the counter will place the sample pulse near the middle of the serial out bit. If no transition is detected, the pulse logic 1609 also pulses when the count=5 to place the next pulse near the middle of the next serial out bit. In an embodiment, the serial word is framed as shown in FIG. 5, thus guaranteeing that at most two sequential bits are the same before a transition occurs. The counter is reset at the next transition. The output of the flip-flop 1607 is supplied to the error detection logic 1506.

Figure 17:
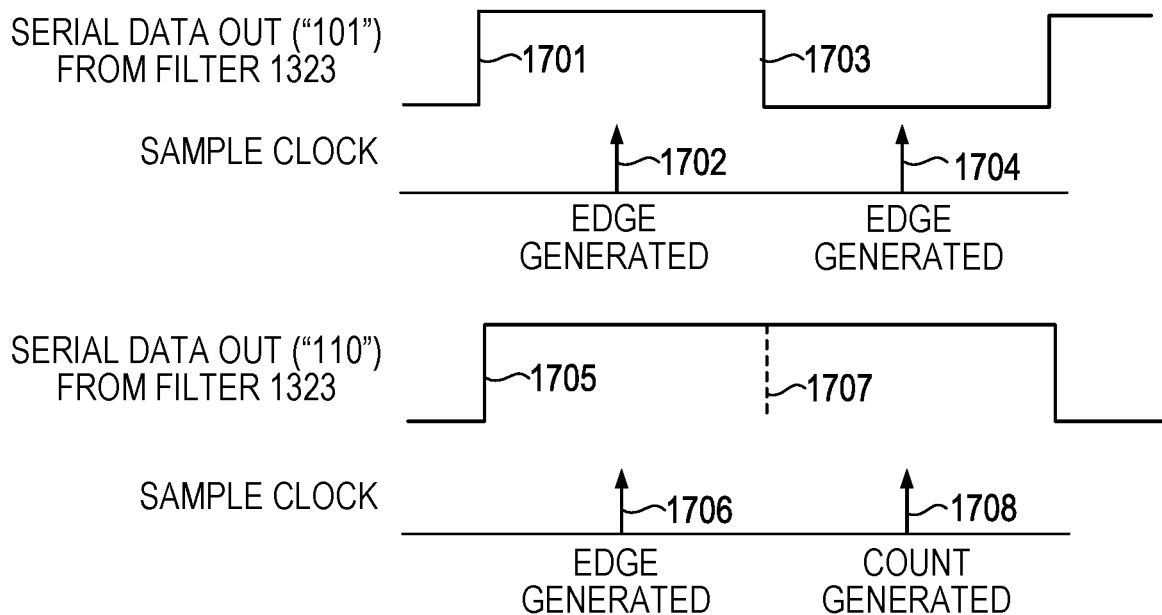
FIG. 17 illustrates a timing diagram of the sampling circuit.

FIG. 17 illustrates a timing diagram of the sample circuit 1502. When the serial data out from filter 1323 (see FIG. 13) has an output sequence "1", "0", "1", the transitions (edges) at 1701 and 1703 drive the pulses 1702 and 1704 (on count=2 after the edge). However, when two sequential "1s" (or "0s") occur, the edge 1705 drives the first pulse 1706 and count=5 drives the second pulse 1708. Due to the framing of the serial word an edge generated pulse should occur next after the count generated pulse 1708. Once the transmitted signal is successfully received, the GATE information and CONFIG information is used by the driver control block.

Figure 18:
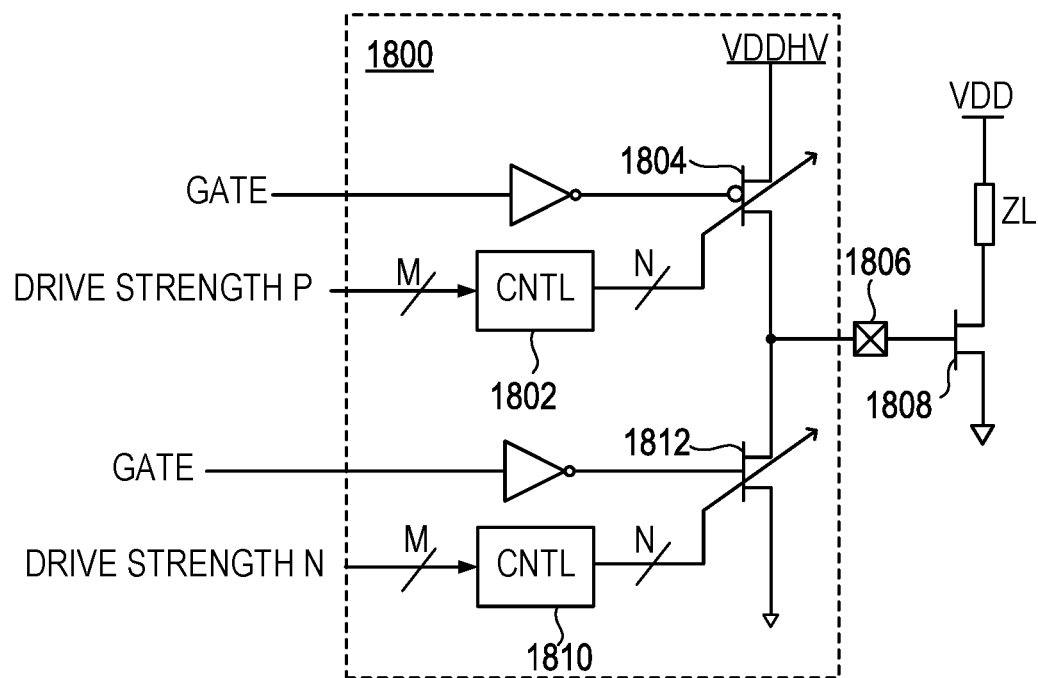
FIG. 18 illustrates an embodiment showing how the drive strength information is used to control the drive strength of transistors generating the gate signal.

FIG. 18 illustrates how driver control block 1800 uses the drive strength signals. PFET control logic 1802 receives the configuration bits Drive Strength P (P2, P1, P0) and adjusts the current supplied by PFET(s) 1804, where PFET 1804 is, e.g., 8 PFET transistors configured in parallel of the same or different sizes (width/length (W/L) ratios), that are used to adjust the current to achieve the percentage drive strength shown, e.g., in FIG. 7, and corresponding to the states S0 to S7 depending upon the setting. The PFET control logic 1802 includes (or is coupled to NVM or other memory) that specifies the drive strength percentages corresponding the configuration bits, and whether arbitrary drive strengths have been provided, and if so, their drive strength values (for S0 and S8) for operation in digital mode and other necessary configuration information. The M configuration bits for the PFETs drive strength, e.g., 3 bits, map to the N signal lines, e.g., 8 signal lines, to control the drive strength current on output terminal 1806, which is coupled to the gate of power transistor 1808. Similarly, the NFET control block 1810 receives M configuration bits (Drive Strength N) to control the drive strength supplied by NFET(s) transistor(s) 1812. The control block 1810 maps the M configuration bits to N control lines to adjust the current supplied by NFET(s) 1812, where NFET 1812 is formed by, e.g., 8 NFET transistors in parallel of the same or different sizes, that are used to achieve the percentage drive strength shown, e.g., in FIG. 7 corresponding to S0 to S8. The PFET transistors 1802 and NFET transistors 1812 also receive at their respective gates a complementary version of the GATE signal (assuming GATE is active high).

Figure 19:
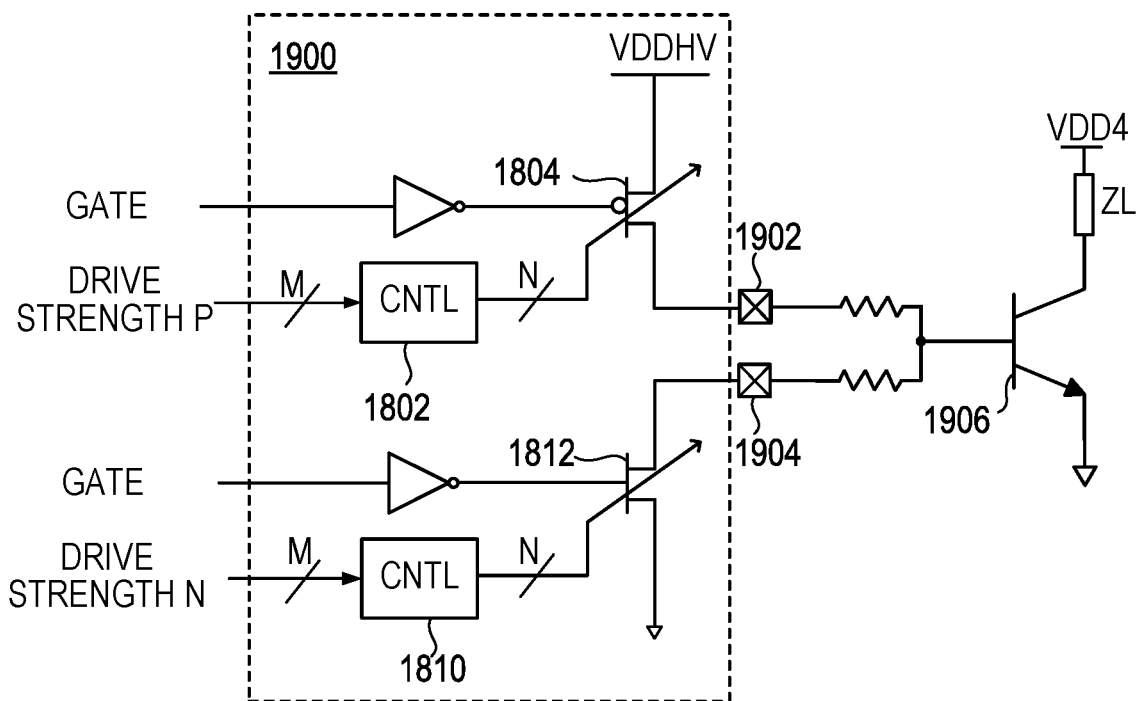
FIG. 19 illustrates an embodiment showing how the drive strength information is used to generate a gate signal combined off-chip.

In an embodiment shown in FIG. 19, rather than supplying a single output 1806, the driver control block 1900, corresponding to driver control block 1010 in FIG. 10, separate output terminals 1902 and 1904 (see VOP and VON in FIG. 11) are supplied by the PFETs 1804 and NFETs 1812 and the output terminals are combined externally to drive a gate of an external transistor 1906. The terminal 1902 provides positive drive current to turn on the external transistor, e.g., IGBT 1906, while the terminal 1904 provides sinking current to turn off the external transistor 1906. While not shown, a Miller clamp may be used in conjunction with the two terminals.

Thus, a system with an isolation communication channel has been described that simultaneously communicates gate and configuration information across the isolation communication channel. A modulator in the transmitter encodes the information for dual communication and a demodulator decodes the transmitted information to achieve, e.g., dynamic variable drive strength control of an isolated gate driver. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   receiving a signal transmitted across a single isolation communication channel as a received signal; and
   demodulating the received signal to determine respective values for gate information and configuration information contained in the received signal based on which of four states the received signal represents.

2. The method as recited in claim 1, further comprising:
   demodulating the received signal in a gate demodulation path to determine the gate information; and
   demodulating the signal in a configuration demodulation path to determine the configuration information.

3. The method as recited in claim 2, further comprising:
   demodulating the received signal as an on off keying (OOK) signal in the gate demodulation path; and
   demodulating the received signal as a modified OOK signal in the configuration demodulation path.

4. The method as recited in claim 3, wherein an output of the configuration demodulation path is determined, at least in part, by an output of the gate demodulation path.

5. The method as recited in claim 3 wherein the configuration demodulation path includes a first sub-demodulation path and a second sub-demodulation path.

6. The method as recited as claim 5 wherein the configuration demodulation path includes an OOK demodulator in the first sub-demodulation path and include an FM demodulator in a second sub-demodulator path.

7. The method as recited in claim 2, further comprising:
demodulating the received signal in a first sub-demodulation path of the configuration demodulation path to detect an envelope to determine the configuration information, presence of the envelope indicating one of the four states and indicating the received signal is changing between a first frequency and a second frequency at a third frequency.

8. The method as recited in claim 7, further comprising:
demodulating the received signal in a second sub-demodulation path of the configuration demodulation path to determine a frequency associated with the received signal and determining the received signal to be in another of the four states based on the frequency.

9. The method as recited in claim 2, further comprising:
demodulating the received signal in the configuration demodulation path to detect the configuration information using a value of the gate information determined in demodulating the received signal in the gate demodulation path.

10. The method as recited in claim 9, further comprising:
selecting a fast path signal or a slow path signal as a selected signal according to the value of the gate information; and
supplying the selected signal to a first sub-demodulation path and to a second sub-demodulation path of the configuration demodulation path, the fast path signal having a higher frequency than the slow path signal when the fast path signal is selected as the selected signal, the fast path signal and the slow path signal being based on the received signal.

11. The method as recited in claim 2, further comprising:
generating a first demodulated signal in a first sub-demodulator of the configuration demodulation path based on a detected frequency of the received signal;
generating a second demodulated signal in a second sub-demodulator of the configuration demodulation path based on detecting presence or absence of an envelope in the received signal; and
generating a configuration demodulation path output based on one or both of the first demodulated signal and the second demodulated signal.

12. The method as recited in claim 2, further comprising:
generating a parallel word of configuration information based on sequential outputs of the configuration demodulation path; and
updating a configuration of a circuit based on the configuration information.

13. The method as recited in claim 12, further comprising the step of checking the parallel word for errors, and not updating the configuration of the circuit if an error are found.

14. The method as recited in claim 1, further comprising:
generating a gate signal to control a gate of a first transistor using the gate information; and
controlling a characteristic of the gate signal using the configuration information.

15. An apparatus comprising:
one or more input terminals to receive a signal transmitted across an isolation communication channel; and
a demodulator circuit coupled to the one or more input terminals to demodulate a received signal to obtain gate information and to obtain configuration information, respective values of the gate information and the configuration information being determined according to which one of four states the demodulator circuit detects in the received signal.

16. The apparatus as recited in claim 15, wherein the demodulator circuit further comprises:
a gate demodulation path to detect if the received signal is oscillating above a predetermined frequency and supply a gate signal indicative thereof; and
a configuration demodulation path to demodulate the received signal to obtain the configuration information.

17. The apparatus as recited in claim 16, wherein an output of the configuration demodulation path is determined, at least in part, by the gate signal.

18. The apparatus as recited in claim 16, wherein the configuration demodulation path further comprises:
a first sub-demodulation path of the configuration demodulation path including an envelope detector to detect if an envelope is present in the received signal and supply a first sub-demodulation path output signal as an indication thereof, presence of the envelope indicating the received signal is changing between a first frequency and a second frequency, presence of the envelope indicating one of the four states of the received signal and supply a fast path demodulation output signal;
a second sub-demodulation path of the configuration demodulation path including a frequency detector to determine if the received signal is within a frequency range and supply a second sub-demodulation path output signal as an indication thereof, being within the frequency range indicative of another of the four states and supply a slow path demodulation output signal; and
wherein a configuration demodulator output signal is determined based on one or both of the first sub-demodulation path output signal and the second sub-demodulation path output signal.

19. The apparatus as recited in claim 16, further comprising:
a serial to parallel conversion circuit coupled to the configuration demodulation path to generate a serial configuration word based on received signals during a plurality of bit times; and
wherein the serial configuration word is used to update one or more configuration settings.

20. The apparatus as recited in claim 19, further comprising:
an error detection circuit to detect errors in the serial configuration word and not update the one or more configuration settings if an error is detected in the serial configuration word.

21. An integrated circuit comprising:
a demodulator to demodulate a signal received from an isolation communication channel to obtain gate information and configuration information transmitted over simultaneously over the isolation communication channel, the demodulator including a plurality of demodulation paths;
wherein the signal includes a first state in which the signal oscillates at a first frequency for first bit time, a second state wherein the signal oscillates at different frequencies during a second bit time, a third state in which the signal oscillates at a third frequency lower than the first frequency during at least a portion of a third bit time, and a fourth state in which the signal is steady state for a fourth bit time; and
an envelope detector in one of the demodulation paths to detect the second state.

* * * * *